United States Patent [19]

Chazenfus

[11] 4,439,689

[45] Mar. 27, 1984

[54] CIRCUIT FOR THE CONTROL OF THE CYCLIC RATIO OF A PERIODIC PULSE SIGNAL AND DEVICE MULTIPLYING BY $2^n$ OF A PULSE SIGNAL FREQUENCY INCORPORATING SAID CONTROL CIRCUIT

[76] Inventor: Henri Chazenfus, 127, Rue Jeanne d'Arc, 75013 Paris, France

[21] Appl. No.: 328,806

[22] Filed: Dec. 9, 1981

[30] Foreign Application Priority Data

Dec. 29, 1980 [FR] France .................. 80 27670

[51] Int. Cl.³ .................. H03K 5/04; H03B 19/00
[52] U.S. Cl. .................. 307/265; 307/273; 328/58; 328/20; 377/47
[58] Field of Search .................. 307/265, 273; 328/20, 328/58; 377/47

[56] References Cited

U.S. PATENT DOCUMENTS 3,646,370 2/1972 Lowe .
3,820,029 6/1974 McKinley .................. 307/265
4,277,697 7/1981 Hall et al. .................. 307/265

OTHER PUBLICATIONS

Journal "Electronics," vol. 48, No. 15, Jul. 1975.
Journal "The Electronic Engineer," vol. 30, No. 1, Jan. 1971.
Journal "Electronics," vol. 49, No. 15, Jul. 22, 1976.
Journal "EDN Electrical Design News," vol. 23, No. 14, Aug. 5, 1978.

Primary Examiner—John S. Heyman
Attorney, Agent, or Firm—Pearne, Gordon, Sessions, McCoy, Granger & Tilberry

[57] ABSTRACT

The invention relates to a circuit for controlling the cyclic ratio of a periodic pulse signal.

This circuit comprises a monostable multivibrator receiving the pulse signal at its switching input, a comparator constituted by an operational amplifier respectively receiving at its inputs the direct and complementary output signals of the monostable multivibrator, the output of said amplifier being connected to the conducting period control input of the multivibrator. The operational amplifier also comprises a control input for the offset voltage of the signals applied at its inputs, said control input making it possible to regulate the cyclic ratio of the multivibrator output signals.

Application to frequency multiplication, particularly for four-state modulation by phase displacement.

2 Claims, 4 Drawing Figures

CIRCUIT FOR THE CONTROL OF THE CYCLIC RATIO OF A PERIODIC PULSE SIGNAL AND DEVICE MULTIPLYING BY $2^n$ OF A PULSE SIGNAL FREQUENCY INCORPORATING SAID CONTROL CIRCUIT

BACKGROUND OF THE INVENTION

The present invention relates to a circuit for controlling the cyclic ratio of a periodic pulse signal, as well as to a device multiplying by $2^n$ the pulse signal frequency incorporating the said control circuit. This invention is applicable to digital transmission and more particularly to four-state modulation by displacement of phases.

In order to provide a better understanding of the application of the invention, particularly to the four-state modulation by phase displacement, it is useful to point out that in the field of digital transmission, the flow rate of a modulating signal or the data quantity transmitted per second (number of bits per second) is associated with a clock or timing signal H of frequency $f_0$. The timing signal H is a squarewave signal of cyclic ratio 0.5. The four-state phase modulation results from the composition of two modulations, by two-state phase displacement, for which the frequency of the associated timing signal is equal to $f_0/2$ and is then called clock H/2. In a transmission chain with respect to the modulator, the modulating signal is separated into two digital trains A and B, whose flow rates are respectively equal to half the flow rate of the signal to be transmitted. The associated clock H/2 is formed by dividing the frequency of clock H by two, generally using a multivibrator. On reception, after allowing for transmission errors, demodulation supplies digital trains A and B. It also makes it possible to obtain again the clock or timing signal H/2. In order to restore the initial modulating signal by interlacing, it is necessary to restore clock H by doubling the frequency of the timing of clock H/2.

The invention is applied more particularly to the performance of the latter operation, i.e. the transformation of clock H/2 into clock H.

The multiplier device of the invention also includes a circuit for controlling the cyclic ratio of a pulse signal. No simple device is known which makes it possible to rapidly control the cyclic ratio of a periodic pulse signal and also no multiplier is known, which makes it possible to multiply the frequency of a signal by two or by a power n of two, without using numerous, costly means, which are difficult to realize.

Among the devices making it possible to control or regulate the cyclic ratio of a pulse signal, the simplest is formed by a monostable multivibrator, whose conducting period is regulated by selecting appropriate values for the capacitive and resistive elements making it possible to fix the duration of this period. This control is not very precise and it is specific to the frequency of the signal.

The known frequency doublers are of the "analog" type, i.e. of the type with "a phase locking loop."

In an analog doubler, clock signal H/2 of frequency $f_0/2$ is applied to the doubler, which provides the double frequency line $f_0$. It is then necessary to filter the line of frequency $f_0$ of clock H and then carry out amplification, followed by shape and phase restoration.

In the case of a frequency doubler using a phase locking loop, a voltage-controlled oscillator supplies a signal of frequency $f_0$, which is double the frequency $f_0/2$ of clock H/2. A phase comparison is then performed between the incident signal of frequency $f_0/2$ and the signal of $f_0/2$ resulting from the division by two of the signal supplied by the voltage-controlled oscillator. The error voltage resulting from this phase comparison makes it possible to lock the voltage-controlled oscillator on frequency $f_0$ in both frequency and phase. The oscillator output supplies the clock signal H of frequency $f_0$.

The analog frequency doubler thus comprises a bandpass filter tuned to frequency $f_0$, a shape restoring amplifier and phase restoring means in order to compensate the time lag caused by filtering. The main disadvantage of this type of doubler is that it is specific to each frequency linked with the digital flow rate. Moreover, the compensation of the range of uncertainties of the frequency of the incident signal is low. Finally, for low speed flows, filtering must be narrow in order to separate the frequency lines, which increases the time lag which has to be compensated.

The frequency doubler of the "phase locking loop" type has better performance characteristics. However, the synchronization and following range of this doubler with respect to the input signal frequency is linked with the factor $K_0$ of the voltage-controlled oscillator. This factor $K_0$ is the frequency sweep covered per volt of control voltage applied to the oscillator. In the case of a quartz oscillator, factor $K_0$ is approximately $10^{-3}$ to $10^{-4}$. Thus, the frequency sweep is very low and this type of double can only be specific to each pulse flow rate to be transmitted. In the case of a conventional oscillator, the flow rate range controlled can vary in a ratio of four between the lowest and highest rates. In order to cover wider ranges, it is necessary to use more complex arrangements requiring range switching operations.

BRIEF SUMMARY OF THE INVENTION

The object of the invention is to obviate these disadvantages and in particular provide a circuit for controlling the cyclic ratio of a periodic pulse signal using a monostable multivibrator, whose conducting period is controlled in simple manner by the control of the offset voltages of the signals applied to the operational amplifier located in a control loop connecting the outputs of the multivibrator to its conducting period control input. In the case of the monostable multivibrator used, a d.c. voltage applied to this input makes it possible to vary the conducting period in a ratio of approximately 30.

The invention is also directed at a device for multiplying by $2^n$ the frequency of a pulse signal permitting a frequency multiplication in wide digital flow ranges, without involving switching, having a simple design and being easy to regulate and control.

The present invention therefore relates to a circuit for controlling the cyclic ratio of a periodic pulse signal, wherein it comprises a monostable multivibrator receiving the pulse signal at its switching input, a comparator constituted by an operation amplifier respectively receiving at its inputs the signals of the direct and complementary outputs of the monostable multivibrator, the output of said amplifier being connected to the conducting period control input of the monostable multivibrator, said operational amplifier also comprising a control input for the offset voltage of the signals applied at its inputs, said control input making it possible to control the cyclic ratio of the output signals of the multivibrator, the latter switching on the rising front of each pulse of the input signal.

The invention also relates to a device for multiplying by $2^n$ the frequency of a pulse signal, n being an integer equal to or higher than 1, wherein it comprises, as a function of the value of n, the series association of at least one cyclic ratio control circuit and at least one supplementary circuit having the same construction as the control circuit, the switching input of the monostable multivibrator of said supplementary circuit being connected to the direct output of the multivibrator of the control circuit, the monostable multivibrator of the supplementary circuit switching on the rising and falling fronts of each pulse received at its input, the operational amplifier of the supplementary circuit, which is connected between the outputs of the multivibrator of the supplementary circuit and the conducting period control input of said multivibrator, also comprising a control input for the offset voltage of the signals applied at its inputs, said control input making it possible to control the cyclic ratio of the output signals of the multivibrator of the supplementary circuit, the cyclic ratio of the output signals of the multivibrator of the control circuit being set at the value 0.5.

According to another feature the cyclic ratio of the output signals of the multivibrator of the supplementary circuit is set to the value 0.5.

BRIEF DESCRIPTION OF THE DRAWINGS

The invention is described in greater detail hereinafter relative to non-limitative embodiments and with reference to the attached drawings, wherein show.

DETAILED DESCRIPTION OF THE PREFERRED EMBODIMENTS

Figure 1:
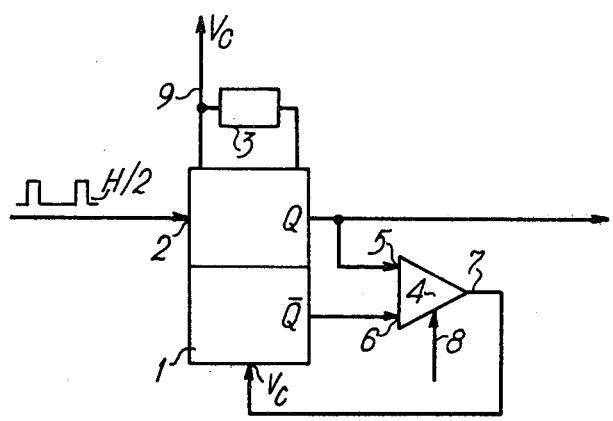
FIG. 1 diagrammatically a circuit for controlling the cyclic ratio of a periodic pulse signal according to the invention.

FIG. 1 diagrammatically shows a circuit for controlling the cyclic ratio of a periodic pulse signal according to the invention. This circuit comprises a monostable multivibrator 1 receiving a pulse signal of frequency $f_0/2$ for example at its switching input 2. This is shown in diagram a of FIG. 2. At 3 it is possible to diagrammatically see the resistance/capacitance circuit making it possible to fix the residual or minimum conducting period of the monostable multivibrator. The control circuit also comprises a comparator constituted by an operational amplifier 4, respectively receiving at its inputs 5, 6 the signals from the direct output Q and complementary output $\overline{Q}$ of monostable multivibrator 1. The output of operational amplifier 4 is connected to the conducting period control input $V_C$ of the monostable multivibrator. The amplifier also has a control input 8 which, in per se known manner, makes it possible to control the offset voltage of the signals applied to the amplifier inputs. According to the invention this makes it possible to control the cyclic ratio of the output signals of multivibrator 1. The signals used here are of the direct output Q of the multivibrator. The multivibrator of this control circuit, in the manner to be shown hereinafter, switches on the rising fronts of the pulses received at multivibrator input 2.

Figure 2:
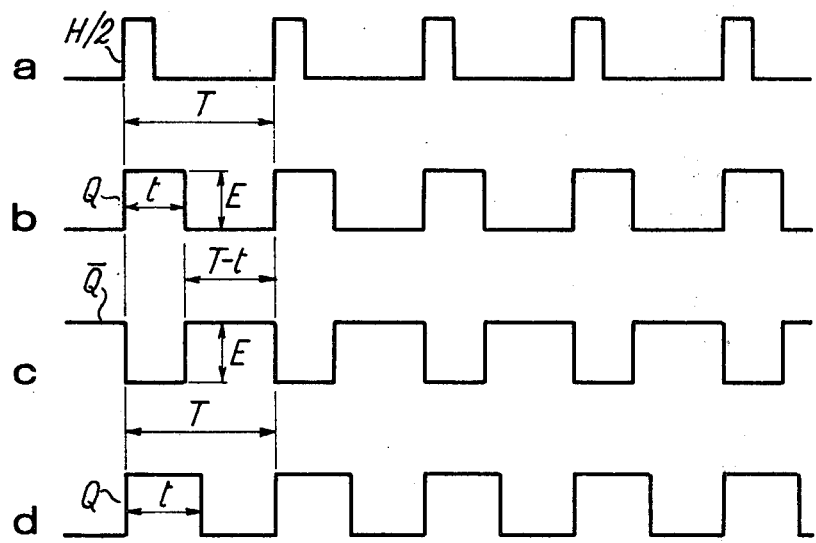
FIG. 2 a diagram of the signals obtained at the direct and complementary outputs of the monostable multivibrator of the control circuit.

FIG. 2 respectively shows at a, b, c and d the pulse signals applied to the multivibrator input 2, the signals collected at the direct output Q and complementary output $\overline{Q}$ thereof in the absence of the operational amplifier and the signal collected at the direct output Q, when the operational amplifier is present between the multivibrator outputs and the conducting period control input $V_C$.

The pulses received at input 2 of multivibrator 1 and which are shown in diagram a make it possible to switch the multivibrator on the rising fronts of these pulses and the signals obtained at the direct output Q and complementary output $\overline{Q}$ of the multivibrator are shown in diagrams b and c. When there is no operational amplifier between the multivibrator outputs and the control input $V_C$ thereof, the cyclic ratio $t/T$ of the multivibrator output pulse signals is essentially dependent on the time constant of the resistance/capacitance circuit 3. Operational amplifier 4, whose inputs are connected to the outputs of monostable multivibrator 1 and whose output is connected to the input $V_C$ thereof makes it possible, by regulating the offset voltages of the signals reaching the input of said amplifier, to control the end of the conducting period of the multivibrator and consequently control the cyclic ratio $t/T$ of the signals obtained e.g. at the direct output Q of the multivibrator. Thus, operational amplifier 4 supplies at the output an error voltage $\Delta V$, which acts on the conducting period of the monostable multivibrator. The value of this error voltage can be adjusted by a regulatable d.c. voltage acting on input 8 of operational amplifier 4. The error voltage in the control loop comprising operational amplifier 4 results from the comparison of the mean value of the direct and complementary signal supplied by multivibrator outputs Q and Q. The control performed is such that the error voltage is stabilized when the cyclic ratio $t/T$ of signal $H/2$ obtained at multivibrator outputs Q and $\overline{Q}$ tends towards the value 0.5 for a given setting. Any variation in the cyclic ratio leads to the offsetting of the error voltage correcting this variation and locks the time constant of the monostable multivibrator on the half-cycle T of clock signal $H/2$. The control described hereinbefore makes it possible to obtain e.g. at direct output Q, the signal shown in diagram d of FIG. 2. In this diagram $t/T$ is equal to 0.5. This control can be automatically performed for a frequency range, whose ratio is approximately 25. It is obvious that the value of ratio $t/T$ is fixed at 0.5 for special applications, particularly for the use of the cyclic ratio control circuit in a device according to the invention and which makes it possible to multiply the frequency of a pulse signal by $2^n$. Obviously this ratio can have some other value for other applications. The multivibrator conducting period is a function of the d.c. voltage $V_C$ applied to the flip-flop control input. This voltage makes it possible to vary the time constant of the monostable flip-flop in a ratio which can reach 25 or 30.

On considering diagrams b and c of FIG. 2 representing the signals appearing at the direct output Q and complementary output $\overline{Q}$ of the multivibrator, when the cyclic ratio of these signals differs from 0.5 and on designating by E the maximum amplitude of the pulse signal obtained at the direct output Q of the multivibrator, the mean value of said signal is:

$$V = E \times (t/T)$$

In the case of diagram b, $V = E/3$ because $t/T = \frac{1}{3}$. On then considering the complementary signal appearing at output Q represented on diagram c the mean value of this signal is:

$$V' = E \times \frac{(T-t)}{T}$$

and, in the example shown in the drawing, $V' = E \times \frac{2}{3}$ because $$\left(\frac{T-t}{T}\right) = \frac{2}{3}.$$

When the cyclic ratio is equal to 0.5 $t = T/2$ and $V = V' = E/2$. The latter value is chosen when the control circuit is used in a $2^n$ frequency multiplier, which will be described in greater detail hereinafter. When there is no operational amplifier, the mean values of voltages V and V' on the outputs of the monostable multivibrator differ and it is possible to write $V - V' = \Delta V$. The relooping of outputs Q and $\overline{Q}$ of the multivibrator on its conducting period control input by means of an operational amplifier makes it possible to approximate V to V', whilst obviously regulating the cyclic ratio to a value of 0.5 for a given frequency $f_0$ and obtain an error voltage at the operational amplifier output. In reality the cyclic ratio is equal to $0.5(1+\epsilon)$, $\epsilon$ being the residual error and $\Delta V = E \cdot \epsilon$. The operational amplifier supplies an error voltage, which is a function of the frequency of the incidence signal and due to its high gain ensures that V is very low, i.e. the cyclic ratio is very close to 0.5. Thus, the same cyclic ratio is retained for a very wide frequency range.

Figure 3:
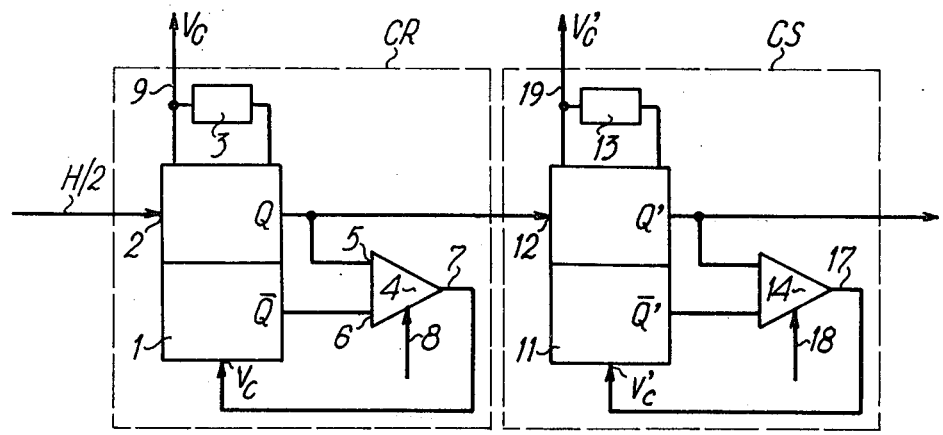
FIG. 3 diagrammatically a frequency multiplier according to the invention.

FIG. 3 shows a device for multiplying the frequency of a pulse signal by $2^n$. This multiplier device incorporates a control circuit CR identical to that of FIG. 1. The same elements carry the same references as in FIG. 1. Obviously the cyclic ratio of the clock signals H/2 supplied by control circuit CR is fixed at the value 0.5, as stated hereinbefore. This control circuit is connected in series with a supplementary circuit CS, whose structure is identical to that of the control circuit. In the same way as the control circuit, the supplementary circuit comprises a monostable multivibrator 11, whose switching input 12 is connected to the direct output Q of the monostable multivibrator of control circuit CR. FIG. 3 also shows a circuit 13 with a time constant RC making it possible to fix the residual conducting period of the monostable multivibrator. Control input $V_{C'}$ makes it possible to vary the conducting period in a ratio of 25 to 30. This voltage is also chosen in such a way that on the rising and falling fronts, the multivibrator switches pulses received at the switching input 12. The direct output Q' and complementary output $\overline{Q}'$ of the multivibrator are respectively connected to the inputs of an operational amplifier 14, whose output 17 is connected to the control input $V_{C'}$ of multivibrator 11. The output signals H of the multiplier are supplied by the direct output Q'. As for the control circuit, operational amplifier 14 comprises a control input 18 making it possible to control the offset voltage of the input signals of said amplifier in such a way as to fix the cyclic ratio of the output signals of this supplementary circuit.

Figure 4:
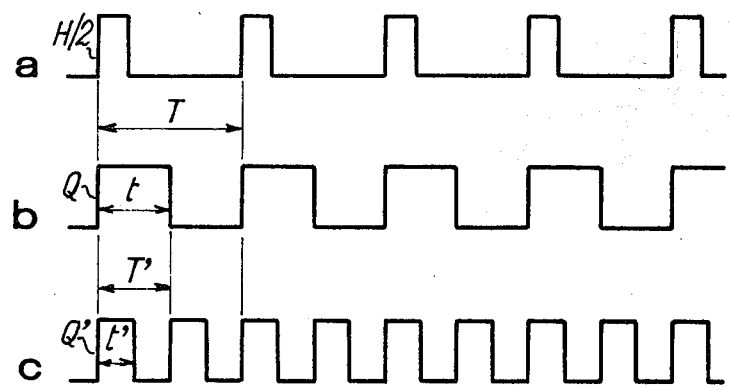
FIG. 4 diagrammatically a diagram of the signals at the outputs of certain elements of this multiplier.

FIG. 4 is a diagram of the signals appearing at certain characteristic points of the multiplier of FIG. 3. Diagram a represents the clock signals H/2 applied to input 2 of multivibrator 1 of control circuit CR. Diagram b represents the signals supplied by the direct output Q of multivibrator 1 of the control circuit.

As stated hereinbefore multivibrator 1 of the control circuit switches the pulses received at its input on the rising front and the cyclic ratio of the signals which it supplies at the output is regulated so as to be equal to 0.5. Diagram c represents the signals obtained at the direct output Q' of monostable multivibrator 11 of supplementary circuit CS. On the rising and falling fronts, this multivibrator switches the pulses received at its input 12 coming from the control circuit output Q. In a control mode corresponding to diagram C of FIG. 3, the cyclic ratio $t'/T'$ of the output signals of multivibrator 11 of supplementary circuit CS is equal to $\frac{1}{2}$. It is obvious that the cyclic ratio $t'/T'$ could differ, as a function of the desired applications of the multiplier. Output Q' of supplementary circuit CS thus supplies pulse signals H, whose frequency $f_0$ is double the frequency $f_0/2$ of the signals H/2 received at input 2 of multivibrator 1 of the control circuit.

In the frequency multiplier described hereinbefore, it is possible to associate in series with the supplementary circuit, further identical supplementary circuits and whereof the cyclic ratio of the output signals is set at a value 0.5 so as to form a multiplier by $2^n$. The value of n obviously depends on the number of supplementary circuits associated with the multiplier.

The multiplier device described hereinbefore makes it possible to double the frequency $f_0/2$ of pulse signals H/2, whose frequency varies e.g between 850 kHz and 25 MHz. When the cyclic ratio of the output signals of the monostable multivibrator of the supplementary circuit is set to the value 0.5, the observed signals are square-wave signals, as shown in diagram c of FIG. 4. The distortion of the cyclic ratio is linked with the amplitude of the even harmonics of the output signal of the amplifier. The ratio of the amplitude of the useful signal to the amplitude of the first even harmonic always exceeds 40 decibels. It is very easy to make up for the variation between the levels of the output signals and the signals of the monostable multivibrator of the supplementary control circuits by controlling the input offset voltages of the error differential amplifiers of each circuit. This control, in the case when the cyclic ratio of the output signals of the multiplier must be equal to 0.5, is carried out on putting the system into operation by means of a spectrum analyzer. The time lag between the output and input of the multiplier is approximately 10 ns. The minimum time constant is approximately 10 ns and the output signal will have a maximum frequency equal to or below 50 MHz. The threshold of the minimum conducting period of each multivibrator is determined by the user by means of time constant circuits 3, 13, which make it possible to choose the time constant variation range. By means of these controls, it is consequently possible to use the multiplier device in a wide frequency range. When the initial controls and settings have been made, the control loops automatically compensate errors if each loop has a sufficient gain. When only the cyclic ratio control circuit is used, this cyclic ratio can vary between 0.1 and 0.9 due to the setting of the offset voltage of operational amplifier 4. For a given setting, it is possible to obtain a fixed cyclic ratio throughout the frequency range.

The multiplier described hereinbefore can be used in digital transmission, more particularly for flow rates between 2.048 and 34.368 Mbits/sec in four-state phase modulation.

What is claimed is:

1. A circuit for generating a periodic pulse signal with frequency independent duty cycle, the pulse frequency being the same as the frequency of an input periodic signal in a wide range of frequencies, wherein it comprises:

a monostable multivibrator receiving the input signal at its trigger input, said periodic signal being subjected to the only restriction to cross only twice the trigger threshold of said multivibrator during its period, the triggering being inhibited during the falling edge of the input signal;

a capacitor, connected to the pulse length control input of said multivibrator, whose charging rate, which determines the length of the output pulse, is controlled by an error signal generated elsewhere in the circuit in order to maintain the output dry cycle at a given value independently of the frequency of the triggering signal over a wide range of frequencies, and whose capacitance can be chosen to move this frequency range from low frequencies to the highest frequency allowed by the residual built-in capacitance of said multivibrator between said pulse length control input;

identical circuits connected on the direct (Q) and complementary ($\overline{Q}$) outputs of said multivibrator, providing two voltages having continuous components proportional to the mean values of the (Q) and ($\overline{Q}$) signals, with the same frequency independence for a given value of the duty cycle and with the same dependence upon fluctuations of the power supplies voltages;

an operational amplifier receiving at its inputs said voltages, the output of said operational amplifier providing said error signal and being connected to the on-state duration control input of said multivibrator, hence changing the charging rate of said capacitor, said charging rate, and therefore the frequency range of operation for a given value of said capacitor, being limited by the output current capability of said operational amplifier, said operational amplifier also comprising a control input for the offset voltage of the continuous voltages applied at its inputs, said control input making it possible to control the duty cycle of the output signals of said multivibrator.

2. A device for multiplying by $2^n$ the frequency of a pulse signal, n being an integer equal to or higher than 1, wherein it comprises, as a function of the value of n, the series association of one duty cycle control circuit, followed by n supplementary circuits have the same contruction as the control circuit, the trigger input of a monostable multivibrator of each said supplementary circuit being connected to the direct output of the preceding circuit, the multivibrator of each supplementary circuit triggering on both the rising and falling front of each pulse received at its input, the operational amplifier of each supplementary circuit, which is connected between the outputs of the multivibrator of said supplementary circuit and the on-state duration control input of said multivibrator, also comprising a control input for the offset voltage of the signals applied at its inputs, said control input making it possible to control the duty cycle of the output signals of said multivibrator of said supplementary circuit, duty cycles of the output signals of the multivibrator of the control circuit and of the multivibrators of all the supplementary circuits, except possibly the last one, being set at the value 0.5.

* * * * *

UNITED STATES PATENT AND TRADEMARK OFFICE
CERTIFICATE OF CORRECTION

PATENT NO. : 4,439,689
DATED : March 27, 1984
INVENTOR(S) : Henri Chazenfus

It is certified that error appears in the above-identified patent and that said Letters Patent are hereby corrected as shown below:

Column 4, line 37, "Q and Q" should read "Q and $\overline{Q}$".

Column 4, line 57, "flip-flop" should read "multivibrator".

Column 4, line 59, "flip-flop" should read "multivibrator".

CLAIMS

Column 7, line 22, claim 1, "dry" should read "duty".

Signed and Sealed this

Tenth Day of July 1984

[SEAL]

Attest:

GERALD J. MOSSINGHOFF

Attesting Officer

Commissioner of Patents and Trademarks